United States Patent [19]

Pelonis

[11] Patent Number: 4,800,330
[45] Date of Patent: Jan. 24, 1989

[54] AC POWER CONTROL

[76] Inventor: Kosta Pelonis, R.R. #2

[21] Appl. No.: 34,602

[22] Filed: Apr. 6, 1987

[30] Foreign Application Priority Data

Jul. 8, 1986 [CA] Canada .................................... 513356

[51] Int. Cl.$^4$ ............................................. G05F 1/455
[52] U.S. Cl. .................................... 323/243; 323/326;
323/907
[58] Field of Search ............... 323/235, 239, 242, 243,
323/319, 324, 326, 366, 369, 902, 907; 330/110

[56] References Cited

U.S. PATENT DOCUMENTS

| | | | |
|---|---|---|---|
| 4,311,956 | 1/1982 | Tolmie, Jr. ...................... | 323/326 X |
| 4,395,660 | 7/1983 | Waszkiewicz ................... | 323/326 X |
| 4,476,554 | 10/1984 | Smith .............................. | 307/117 X |
| 4,580,088 | 4/1986 | Bloomer .......................... | 323/243 X |
| 4,686,450 | 8/1987 | Pichat ............................. | 323/907 X |

OTHER PUBLICATIONS

Tabey, Graeme and Huelsman, "Operational Amplifiers, Design and Applications", 1971, p. 243.

*Primary Examiner*—Patrick R. Salce
*Assistant Examiner*—Kristine Peckman
*Attorney, Agent, or Firm*—Paul and Paul

[57] ABSTRACT

A device for regulating delivery of power from an AC voltage source to a load such as a lamp, a motor, a heating element or the like is described. Electronic circuitry responsive to the AC voltage generates a periodic signal whose magnitude indicates the instantaneous phase angle of the AC voltage relative to the most recent zero crossover of the AC voltage throughout the entirety of each half cycle of operation. A comparator generates a triggering signal when the phase angle signal corresponds to a threshold signal which may be manually set by adjustment of a voltage divider or which may be generated by a sensor in response to a predetermined condition, such as ambient light level or temperature, which is to be regulated by appropriate delivery of power to the load. The triggering signal is applied to a triac series connected with the load to initiate conduction of load current. The device permits the phase angle at which current conduction is initiated in each half cycle of operation to be controlled over substantially the full range of zero to 180 degrees.

5 Claims, 1 Drawing Sheet

AC POWER CONTROL

FIELD OF THE INVENTION

The invention relates to the regulation of AC power consumption and more specifically to controlling the operation of an AC load such as a light, motor, heating elements or the like.

BACKGROUND OF THE INVENTION

Controls which display relatively low power dissipation are now commonly available to regulate power delivered by an AC line source to a load. For example, in connection with an incandescent lighting element, it is common to series connect the lighting element with a triac, a device which requires triggering in each half cycle of the AC line voltage for conduction of load current. The required triggering signal may be generated directly from the AC line voltage by a resistive voltage divider, and may be applied to the triac through a device with a predetermined turn-on voltage, such as a diac, to ensure predictable triggering. One element of the resistive divider may be a variable resistor whose resistance value can be manually adjusted by a user to regulate triggering and ultimately the amount of power delivered by the device to the the load.

This arrangement and similar variants thereof are common referred to as "phase angle control". In essence, the resistive divider and threshold turn-on device suppress triggering of the triac and conduction of load current until the AC voltage has achieved a certain phase angle relative to the most recent zero crossover of the AC voltage. One significant limitation associated with such prior art devices is that phase angle can only be regulated in the range of 0 to 90 degrees in each half-cycle regardless what ultimate voltage divider ratio is obtained. In the context of lighting control, power consumption cannot be conveniently reduced to less than about one half of that otherwise expected under full line voltage. In the operation of motors, such controls permit speed control only over a very specific range, control over very low speed operation being unavailable. With certain prior art devices which use RC timing circuits to generate a triggering signal, there is the additional disadvantage that operation is dependent on line voltage and frequency. Accordingly, a power controller appropriate for operation with 110 volt AC line sources at 60 hertz may not operate properly in response to 220 volt AC line source or to one involving a different frequency.

It is an object of the present invention in preferred form to provide an AC power controller which overcomes the various shortcomings associated with the prior art devices.

BRIEF SUMMARY OF THE INVENTION

In one aspect, the invention provides a device for regulating delivery of AC power from an AC voltage source to a load. Switching means are provided for controlling flow of current through the load in response to the AC voltage. The switching means have a conductive state which permits a flow of current through the load and a non-conductive state in which no substantial load current can be conducted. The switching means are of a type requiring application of a triggering signal in each half-cycle of the AC voltage to initiate conduction.

Phase angle indicating means responsive to the AC voltage serve to generate a signal indicating the instantaneous phase angle of the AC voltage relative to the most recent zero crossover. These means preferably comprise signal generating means that generate a signal of continuously increasing magnitude, means for detecting the occurrence of a zero crossover in the AC voltage, and means which reset the signal generating means (restoring the phase angle signal to some preselected initial value) whenever a zero crossover of the AC voltage has been detected. Such an arrangement lends itself to the generation of a phase angle signal which can uniquely indicate phase angles both less than and greater than 90 degrees.

Comparison means are provided for comparing the phase angle signal with a threshold signal. When the phase angle signal corresponds to the threshold signal, a triggering signal is applied to the switching means thereby initiating conduction. In particular embodiments of the invention, the threshold signal generating means may take the form of a voltage divider which includes a sensor whose resistance varies in response to the current state of a predetermined condition such as ambient light intensity of temperature, and power can be delivered to the load, a light or heating element, in a manner which tends to regulate the predetermined condition. Since a power controller embodying the invention can be readily adapted to permit load current conduction to be initiated at a phase angle less than and greater than 90 degrees, the load can be operated over a wider operation range and the predetermined condition can be better controlled.

Other advantages associated with the present invention will become more apparent from a detailed description of a preferred embodiment below.

DESCRIPTION OF THE DRAWINGS

The invention will be better understood with reference to drawings in which.

DESCRIPTION OF PREFERRED EMBODIMENT

Figures 1, 2:
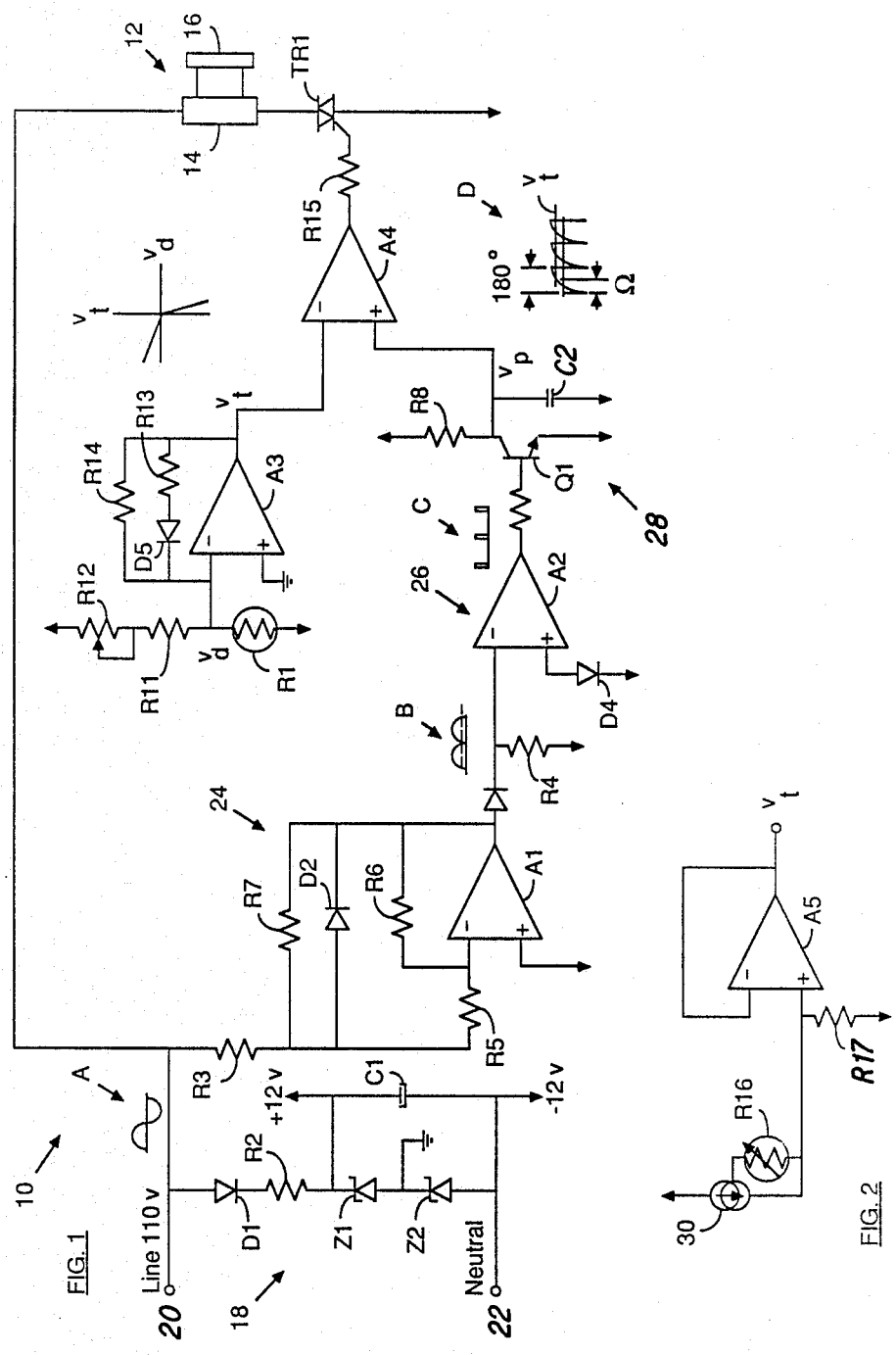
FIG. 1 is a schematic representation of a power controller adapted to regulate the operation of a lighting element in response to ambient light levels; and, FIG. 2 is a schematic representation of an alternative sensing arrangement which can be used in connection with the circuit of FIG. 1 to permit remote sensing of light levels.

Reference is made to FIG. 1 which illustrates an AC power regulator 10 that controls the application of an AC line voltage from a 110 v. AC line source to an AC load 12, consisting of a solid-state ballast 14 and an associated fluorescent lighting element 16, with a view to avoiding unnecessary light generation and power consumption. A triac TR1 series connected with the ballast 14 controls the flow of load current through the ballast. Conduction in the triac TR1 is self-extinguishing, and a trigger signal must be applied to the triac TR1 in each half cycle of operation to initiate conduction of load current. A photoresistor R1 whose resistance varies inversely with the intensity of light impinging on the photoresistor is appropriately located to sense ambient light levels. The triac TR1 is periodically triggered for conduction in response to the resistance of the photoresistor to vary light production inversely with ambient light levels.

The power controller 10 includes a DC power supply generally indicated by the reference numeral 18 which operates from the line voltage and which supplies DC power to a variety of electrical and electronic components including a number of operational amplifiers. The power supply 18 includes a diode D1, a resistor R2 used to limit surge currents and two zener diodes Z1, Z2, which are series connected between terminals 20, 22. The zener diodes Z1, Z2 have a nominal breakdown voltage of 12 volts. A capacitor C1 shunts the diodes Z1, Z2 and serves to smooth the half-wave rectified voltage normally produced across the zener diodes Z1, Z2. The DC power supply accordingly produces supply voltages, relative to a ground reference constituted by the circuit node between the zener diodes Z1, Z2, of positive and negative 12 volts.

The power controller 10 includes mean for generating a phase angle signal which indicates the instantaneous phase angle of the AC line voltage relative to the most recent zero crossover. These means include a full-wave rectifier 24, a comparator circuit 26 which cooperates with the full-wave rectifier 24 to detect zero crossovers in the AC line voltage, and a waveform generator 28 whose operation is regulated by the comparator circuit 26 to produce the required phase angle signal.

The full-wave rectifier 24 comprises an operational amplifer A1. When the AC line voltage is in a positive half-cycle, the voltage presented by the full-wave rectifier 24 to the zero crossover detector is determined largely by the resistors, R3, R4 which, due to presence of the diode D2 in feedback loop between the output and inverting terminal of the amplifier A1, function effectively as a voltage divider scaling the AC line voltage. When the AC line voltage is negative, the full-wave rectifier effectively amplifiers the AC line voltage according to a gain determined by the values of the resistors R3, R5 and R6. The resultant full-wave rectified signal floats on the −12 volt supply. The resistance value of the various resistors can be selected in a manner which will be apparent to those skilled in the art to produce a full-wave rectified waveform as indicated at B in which both positive and negative going cycles of the AC line voltage are transformed into substantially identical waveforms. However, for purposes of detecting zero crossovers, such precise and symmetric rectification of negative and positive half cycles of the AC line voltage is not necessary.

The comparator circuit 26 comprises an operation amplifier A2 which is operated open-loop. The full-wave rectified signal generated by the rectifier 24 is received at the inverting terminal of the amplifier A2. The non-inverting terminal of the amplifier is coupled to the negative voltage supply through a diode D4 which raises the non-inverting terminal to a potential of about 0.5 volts a bove the −12 volt supply. The full-wave rectified signal indicated at B is effectively compared with the offset signal created by the diode D4, that offset signal being indicated by a dashed horizontal line against the full-wave rectified waveform B. The output signal generated by the amplifier A2 is indicated by reference character C and may be seen to consist of a series of pulses. When the full-wave rectified signal exceeds the 0.5 volt potential, the output of the amplifier A2 is driven to the −12 supply voltage. However, when the full-wave rectified signal drops below the 0.5 volt threshold, the output of the amplifier A2 is driven to the positive supply voltage. Since the rectified waveform has a value less than the 0.5 volt threshold only at the occurrence of zero crossovers in the AC line voltage, and then only momentarily, the output of the waveform A2 is a series of narrow pulses timed to occur at zero crossovers of the line voltage.

The waveform generator 28 comprises a resistor R8 series connected with a capacitor C2 between the positive and negative 12 volt supply lines. The phase angle signal designated by the reference character $V_p$ is generated at the circuit node between the resistor R8 and capacitor C2. The circuit node is initially at the minus 12 volt potential of the DC power supply and rises exponentially towards positive 12 volts as the capacitor charges. A transistor Q1 shunts the capacitor C2, and when a pulse generated by the comparator circuit 26 is applied to the base of the transistor Q1 through a current limiting resistor R9, the transistor switch Q1 discharges the capacitor C2. Since the pulses generated by the comparator circuit 26 occur at each zero-crossover of the AC line voltage, the RC circuit consisting of the resistor R8 and capacitor C2 is reset at each zero-crossover, and a periodic waveform as indicated by reference character D is consequently generated at the circuit node between the resistor R8 and capacitor C2.

It will be apparent from the waveform D that a signal of continuously increasing magnitude is generated by the waveform generator 28 during each half-cycle of the AC line voltage. Since the signal is reset to the same starting value (the negative supply voltage) at the start of each half-cycle, there is consequently a predictable one-to-one correspondence between the magnitude of the waveform $V_p$ and the instantaneous phase angle of the line voltage relative to the most recent zero-crossover. This relationship exists throughout substantially the entirety of each half-cycle neglecting the period of time during which the waveform generator is being reset.

The photoresistor R1 is part of a resistive voltage divider connected between the positive and negative 12 volt supply lines. The voltage divider includes a fixed-value resistor R11 and a variable resistor R12 that are series connected with the photoresistor R1. The magnitude of the divider voltage (indicated by the reference character $V_d$), varies inversely with the resistive value of the photoresistor R1 and consequently inversely with ambient light intensity.

The divider voltage $V_d$ is received at the inverting terminal of an amplifier A3, and receives a different level of amplification depending on its polarity. This will be apparent from the waveform indicated by reference character E which represents the transfer function relating the threshold voltage $V_t$ and the divider voltage $V_d$. It will be noted that the amplifier has a lower gain when the divider voltage is negative, and a much higher gain when the divider voltage is positive. The difference in gain is created by provision of a feedback loop between the output and inverting terminal of the amplifier A3 consisting of a diode D5 series connected with a resistor R13. It will be apparent to those skilled in the art that the gain provided by the amplifier A3 for positive divider voltages is proportional to the magnitude of a feedback resistor R14, and for negative divider voltages, is proportional to the magnitude of the parallel combination of the resistors R13 and R14.

An operational amplifier A4 is operated open-loop as a comparator. The phase angle signal $V_p$ is received at the non-inverting terminal of the amplifier A4, and the threshold signal $V_t$ is received at the inverting terminal. When, during any half-cycle of the AC line voltage, the magnitude of the phase angle signal $V_p$ has risen to a value greater than or equal to the threshold voltage, the output terminal of the amplifier A4 rises to the positive DC supply voltage. Otherwise, the output terminal of the amplifier A4 is at the negative DC supply voltage. Since the output terminal of the amplifier A4 is coupled through a resistor R15 to the trigger terminal of the triac TR1, a triggering signal is applied to the triac TR1 to initiate conduction of load current whenever the magnitude of the phase angle signal $V_p$ exceeds the magnitude of the threshold signal $V_t$.

The significance of this arrangement will be apparent from a brief discussion of the waveform D in FIG. 1 that represents the phase angle signal. The threshold voltage $V_t$ which is produced in response to a slowly changing condition, namely, ambient light level, is comparatively constant over a limited number of half cycles of the line voltage and has consequently been represented as a horizontal line against the phase angle signal. During each half-cycle of the AC line voltage, the phase angle signal $V_p$ rises from a value of $-12$ volts up to about 19.5 volts before resetting of the waveform generator 28 occurs. When the phase angle voltage corresponds to the threshold voltage, as at the phase angle $\Omega$ which is somewhat in excess of 90 degrees, the triac TR1 is triggered and assumes a conductive state. It will be apparent to those skilled in the art that the range of the threshold voltage $V_t$ can be appropriately selected so that the phase angle $\Omega$ can vary from about 0 degrees to about 180 degrees. Accordingly, this arrangement permits light production by the lighting element 18 to be controlled continuously through its full operating range, and one is not limited to a range extending from fifty percent power consumption to full power consumption. Additionally, the phase angle at which conduction of load current occurs is not affected by line voltage or line frequency to an appreciable degree.

As mentioned above, the amplifier A3 exhibits different gains depending on the polarlity of the divider voltage $V_d$. This arrangement is particularly significant in the operation of the fluorescent lighting element 16, given that the power regulator 10, unlike the prior art devices described above, is capable of applying much less then 50 percent of total power which would be applied to the fluorescent lighting element 16 in response to full line voltage. In particular, if the fluorescent lighting element 16 has, for example, a power rating of 100 watts and is of conventional design, the lamp may typically deteriorate if operated at less than about 40 watts. By providing lower gain when the divider voltage $V_d$ is below a particular threshold voltage (in this case the ground reference potential) there is less tendency for the fluorescent lighting element 16 to be driven at excessively low power ratings as ambient light levels increase significantly. This arrangement has similar significance in connection with the operation of a motor where it may be undersirable to operate the motor at very low operating speeds for extended periods of time. It will be appreciated that the circuitry associated with the amplifier A3 may be adapted to limit the uppermost value of the threshold voltage signal $V_t$ if it is felt desirable not to operate an AC load below a certain power level.

FIG. 2 illustrates an alternative sensor arrangement for generating the signal $V_t$, more specifically, one involving what is commonly referred toas a "two wire transmitter". A current source 30 is regulated in resposne to the instantaneous magnitude of the resistance of a photoresistor R16, both of which can be remotely located from the remainder of the control circuitry, to sense light levels wherever required. The current signal can be transmitted along a long length of wire to a current sensing resistor R17 connected to the $-12$ volt supply. An operation amplifier A5 in a unity gain follower configuration generates the threshold voltage $V_t$ which now corresponds to the voltage developed across the current sensing resistor R17.

It will be appreciated that a particular embodiment and application of the present invention has been described. Although described specifically in the context of lighting control, the phase angle control concepts embodied in the invention can also be applied with advantage to motor control. Because controllers can be constructed according to the principles of the invention to initiate load current conduction over a range of phase angles extending from about 0 to 180 degrees, the very significant advantage is obtained that motor speed can be controlled over a very wide range, from just about no motor operation to full speed operation, within practical limits. The threshold signal used to control motor operation need not be generated in response to a sensed condition, but can be generated by a manually-operable control speed control which merely sets a constant operating speed. Other applications of the present invention will be apparent to those skilled in the art.

I claim:

1. A device for regulating delivery of ac power from an ac voltage source to a load in response to changes in the state of a predetermined condition, the ac voltage source having an instantaneous phase angle, the device comprising: a switching means for controlling flow of current through the load in response to the ac voltage, the switching means having a conductive state in which the switching means permit flow of current through the load and a non-conductive state in which the switching means prevent flow of current through the load, the switching means requiring application of a triggering signal in each half cycle of the ac voltage to assume the conductive state;

phase angle signal generating means responsive to the ac voltage for generating a phase angle signal corresponding to the instantaneous phase angle of the ac voltage relatie to the most recent zero crossover of the ac voltage;

sensor means for sensing the current state of the predetermined condition, the sensor means comprising a sensor whose resistance varies with the current state of the predetermined condition;

threshold signal generating means responsive to the sensor means for generating a threshold signal varying with the sensed current state of the predetermined condition, the threshold signal generating means comprising:
    (a) means defining a voltage divider, the sensor being an element of the voltage divider;
    (b) dc supply means adapted to be powered by the ac voltage for so applying a dc voltage to the voltage divider that a divider voltage whose magnitude is dependent on the resistance of the sensor is generated; and
    (c) amplifier means for amplifying the divider voltage; and, comparison means for comparing the phases angle signal with the threshold signal and for applying a triggering signal to the switching means whenever the phase angle signal corresponds to the threshold signal.

2. A device as claimed in claim 1 in which the amplifier means include gain control means for making the gain of the amplifier dependent on the magnitude of the divider voltage.

3. A device as claimed in claim 2 in which the gain control means are adapted to produce a first gain when the divider voltage exceeds a preselected value and a second gain when the divider voltage is less than exceeds a preselected value.

4. A device according to claim 3 wherein the preselected value is about zero volts.

5. A device for regulating delivery of ac power from an ac voltage source to a load in response to changes in the state of a predetermined condition, the ac voltage source having an instantaneous phase angle, the device comprising:

a switching means for controlling flow of current through the load in response to the ac voltage, the switching means having a conductive state in which the switching means permit flow of current through the load and a non-conductive state in which the switching means prevent flow of current through the load, the switching means requiring application of a triggering signal in each half cycle of the ac voltage to assume the conductive state;

phase angle signal generating means responsive to the ac voltage for generating a phase angle signal corresponding to the instantaneous phases angle of the ac voltage relative to the most recent zero crossover of the ac voltage, the phase angle generating means comprising:

(a) zero crossover detection means for detecting zero crossovers of the ac voltage, the zero crossover detection means comprising:

(1) full-wave rectification means for producing a fullwave rectified signal corresponding to the ac voltage; and (2) pulse-generating means for producing a pulse whenever the magnitude of the full-wave rectified signal is less than a predetermined threshold value;

(b) resettable signal generating means for generating a predetermined signal of continuously increasing magnitude whenever the signal generating means are reset, the predetermined signal corresponding to the phase angle signal; the resettable signal generating means comprising an RC charging circuit, the RC charging circuit having a time constant substantially determined by the product of the resistance of a single resistor and the capacitance of a single capacitor; and (c) resetting means responsive to the zero crossover detection means for resetting the resettable signal generating means whenever a zero crossover of the ac voltage has been detected, the resetting means comprising a semiconductor switching means triggered to discharge the capacitor whenever the pulse generating means produces a pulse, the semiconductor switching means comprising a transistor; and sensor means for sensing the current state of the predetermined condition;

threshold signal generating means responsive to the sensor means for generating a threshold signal varying with the sensed current state of the predetermined condition;

comparison means for comparing the phase angle signal with the threshold signal and for applying a triggering signal to the switching means whenever the phase angle signal corresponds to the threshold signal.

* * * * *

UNITED STATES PATENT OFFICE
CERTIFICATE OF CORRECTION

Patent No. 4,800,330              Dated January 24, 1989

Inventor(s)  Kosta Pelonis, R.R. No. 2

It is certified that error appears in the above-identified patent and that said Letters Patent is hereby corrected as shown below:

Column 3, line 54, "a bove" should be --above--.

Column 5, line 57, "undersiderable" should be --undesirable--.

Column 5, line 66, "toas" should be --to as--.

Column 5, lines 67 and 68, "resposne" should be --response--.

Column 6, line 46 "relatie" should be --relative--.

Column 7, lines 10 and 11, "than exceeds a" should be --than the--.

Column 8, line 2 "fullwave" should be --full-wave--.

Signed and Sealed this

Fourth Day of July, 1989

*Attest:*

DONALD J. QUIGG

*Attesting Officer*    *Commissioner of Patents and Trademarks*